US008968469B2

(12) United States Patent
Basu et al.

(10) Patent No.: US 8,968,469 B2
(45) Date of Patent: Mar. 3, 2015

(54) SEMICONDUCTOR DEVICE AND METHOD OF MANUFACTURE THEREOF

(75) Inventors: Arnab Basu, Durham (GB); Max Robinson, Durham (GB); Ben Cantwell, County Durham (GB); Andy Brinkman, Durham (GB)

(73) Assignee: Kromek Limited, Sedgefield (GB)

( * ) Notice: Subject to any disclaimer, the term of this patent is extended or adjusted under 35 U.S.C. 154(b) by 1118 days.

(21) Appl. No.: 12/901,780

(22) Filed: Oct. 11, 2010

(65) Prior Publication Data

US 2011/0024877 A1 Feb. 3, 2011

Related U.S. Application Data

(62) Division of application No. 12/158,114, filed as application No. PCT/GB2006/004864 on Dec. 21, 2006, now abandoned.

(30) Foreign Application Priority Data

Dec. 21, 2005 (GB) .................................. 0526070.8
Dec. 21, 2005 (GB) .................................. 0526073.2

(51) Int. Cl.
*C30B 21/02* (2006.01)
*H01L 21/02* (2006.01)
(Continued)

(52) U.S. Cl.
CPC .......... *H01L 21/02568* (2013.01); *C30B 11/00* (2013.01); *C30B 29/48* (2013.01); *H01L 21/02378* (2013.01); *H01L 21/02381* (2013.01); *H01L 21/02395* (2013.01); *H01L 21/02474* (2013.01); *H01L 21/02477* (2013.01); *H01L 21/0248* (2013.01); *H01L 21/02502* (2013.01); *H01L 21/02505* (2013.01); *H01L 21/0251* (2013.01); *H01L 21/02562* (2013.01); *H01L 21/02617* (2013.01)
USPC .............................. 117/89; 117/104; 117/956

(58) Field of Classification Search
USPC ............................................ 117/89, 104, 956
See application file for complete search history.

(56) References Cited

U.S. PATENT DOCUMENTS 4,689,650 A 8/1987 Dinan
4,699,688 A 10/1987 Shastry
(Continued)

FOREIGN PATENT DOCUMENTS

DE 197 11 849 A1 9/1998
EP 0 343 738 A2 11/1989
(Continued)

OTHER PUBLICATIONS

Blue, M.D., "Optical Absorption in HgTe and HgCdTe," Physical Review, vol. 134, No. 1A, A226-A234 (1964).
(Continued)

*Primary Examiner* — Bob M Kunemund
(74) *Attorney, Agent, or Firm* — Popovich, Wiles & O'Connell, P.A.

(57) ABSTRACT

A structure including a substrate, an intermediate layer provided and formed directly onto the substrate, a transition region, and a group II-VI bulk crystal material provided and formed as an extension of the transition region. The transition region acts to change the structure from the underlying substrate to that of the bulk crystal. In a method of manufacture, a similar technique can be used for growing the transition region and the bulk crystal layer.

6 Claims, 2 Drawing Sheets

(51) Int. Cl.
*C30B 11/00* (2006.01)
*C30B 29/48* (2006.01)

(56) References Cited

U.S. PATENT DOCUMENTS

| | | | |
|---|---|---|---|
| 4,710,794 | A | 12/1987 | Koshino et al. |
| 4,826,784 | A | 5/1989 | Salerno et al. |
| 4,965,649 | A | 10/1990 | Zanio et al. |
| 4,970,567 | A | 11/1990 | Ahlgren et al. |
| 5,306,386 | A | 4/1994 | de Lyon |
| 5,389,792 | A | 2/1995 | DiMarzio et al. |
| 5,581,117 | A | 12/1996 | Kawano |
| 5,814,149 | A | 9/1998 | Shintani et al. |
| 5,838,053 | A | 11/1998 | Bevan et al. |
| 5,861,626 | A | 1/1999 | Chandra et al. |
| 6,127,203 | A | 10/2000 | Wan et al. |
| 6,281,039 | B1 | 8/2001 | Marion |
| 6,468,882 | B2 | 10/2002 | Motoki et al. |
| 6,733,591 | B2 | 5/2004 | Anderson |
| 6,784,085 | B2 | 8/2004 | Cuomo et al. |
| 6,890,809 | B2 | 5/2005 | Karpov et al. |
| 6,906,331 | B2 | 6/2005 | Choo et al. |
| 2002/0028564 | A1 | 3/2002 | Motoki et al. |
| 2003/0024471 | A1 | 2/2003 | Talin et al. |
| 2003/0034500 | A1 | 2/2003 | Demkov et al. |
| 2003/0049898 | A1 | 3/2003 | Karpov et al. |
| 2004/0183023 | A1 | 9/2004 | Choo et al. |
| 2005/0183658 | A1 | 8/2005 | Nakahata et al. |
| 2005/0247260 | A1 | 11/2005 | Shin et al. |
| 2006/0011135 | A1 | 1/2006 | Dmitriev et al. |
| 2008/0315342 | A1 | 12/2008 | Basu et al. |
| 2009/0053453 | A1 | 2/2009 | Basu et al. |

FOREIGN PATENT DOCUMENTS

| | | |
|---|---|---|
| EP | 1 019 568 B1 | 6/2002 |
| EP | 1 691 422 A1 | 8/2006 |
| FR | 2 612 335 A1 | 9/1988 |
| FR | 2 852 146 A1 | 9/2004 |
| JP | 61205693 A | 9/1986 |
| JP | 5315582 A | 11/1993 |
| JP | 08-167573 A | 6/1996 |
| JP | 2001200366 A | 7/2001 |
| JP | 2005-159156 A | 6/2005 |
| WO | WO 95/31824 A1 | 11/1995 |
| WO | WO 02/44443 A1 | 6/2002 |
| WO | WO 02/067014 A1 | 8/2002 |
| WO | WO 2005/053038 A1 | 6/2005 |
| WO | WO 2005/060011 A1 | 6/2005 |

OTHER PUBLICATIONS

Abstract for DE 197 11 849 A1 (1 page), Sep. 1998.
Abstract for FR 2 612 335 A1 (1 page), Sep. 1988.
Abstract for FR 2 852 146 A1 (1 page), Sep. 2004.
Abstract for JP 61205693 A (1 page), Sep. 1986.
Abstract for JP 5315582 A (1 page), Nov. 1993.
Abstract for JP 2001200366 A (1 page), Jul. 2001.
Abstract for WO 2005/053038 A1 (1 page), Jun. 2005.
Abstract for WO 2005/060011 A1 (1 page), Jun. 2005.
Hong et al., "Growth and Photoconductor Properties of HgCdTe Epilayers Grown by Hot Wall Epitaxy Method," Journal of Crystal Growth, 240(1-2):135-141 (2002).
Bhat et al., "Growth of (100) Oriented CdTe on Si Using Ge as a Buffer Layer," Appl. Phys. Lett., 64(5):566-568 (1994).
Kim et al., "Structural and Optical Properties of a Strained CdTe/GaAs Heterostructure Grown by Temperature-Gradient Vapor Transport Deposition at Low Temperature," Thin Solid Films, 259(2):253-258 (1995).
Lalev et al., "Hot Wall Epitaxy of High-Quality CdTe/Si(111)," Journal of Crystal Growth, 256(1-2):20-26 (2003).
Leo et al., "Influence of a ZnTe Buffer Layer on the Structural Quality of CdTe Epilayers Grown on (100) GaAs by Metalorganic Vapor Phase Epitaxy," J. Vac. Sci. Technology B, 14(3):1739-1744 (May/Jun. 1996).
Rujirawat et al., "High Quality Large-Area CdTe(211)B on Si(211) Grown by Molecular Beam Epitaxy," Appl. Phys. Lett, 71(13):1810-1812 (1997).
Mar. 13, 2007 International Search Report for PCT/GB2006/004868 (2 pages).
May 31, 2006 UK Search Report for Patent Application No. GB0526072.4 (1 page).
May 4, 2007 International Search Report for PCT/GB2006/004864 (3 pages).
May 11, 2006 UK Search Report for Patent Application No. GB0526070.8 (1 page).
Mar. 30, 2006 UK Search Report for Patent Application No. GB0526073.2 (1 page).
May 31, 2006 UK Search Report for Patent Application No. GB0526075.7 (1 page).
May 7, 2007 International Search Report for PCT/GB2006/004859 (2 pages).

SEMICONDUCTOR DEVICE AND METHOD OF MANUFACTURE THEREOF

FIELD OF THE INVENTION

The present invention relates to a semiconductor device and a method of manufacture therefore. In particular, the present invention relates to a device comprising a group II-VI material formed on a substrate of a dissimilar material, and a method for forming such a structure.

DISCUSSION OF THE PRIOR ART

Single crystal materials have a number of important applications. For example, bulk cadmium telluride (CdTe) and cadmium zinc telluride (CZT) semiconductors are useful as x-ray and gamma-ray detectors which have application in security screening, medical imaging and space exploration amongst other things.

For many applications, it is desired to have single crystals of large size and thickness, which can be formed rapidly with optimum uniformity and minimum impurities.

Traditionally, single crystals have been formed using direct solidification techniques, such as by the Bridgman, travelling heater (THM), gradient freeze (GF) or other liquid phase or self-seeding vapour phase crystal growth methods in which the crystals are grown from the melt. With these conventional methods, it has been difficult to form high quality crystals consistently, or to form single crystals having a diameter greater than 25 mm or 50 mm. In particular, with these known methods of crystal formation, dislocations, sub-grain boundaries and twins form easily. For high pressure Bridgman methods, there is also the potential problem of pipe formation.

These problems are particular problems when forming CdTe crystals. The inclusion of zinc to make CZT reduces these problems to some extent as the zinc strengthens the lattice, however zinc segregation at the solidification interface may result in graded axial compositional profiles. However, higher temperatures are required for CZT growth, and this is undesirable. Also, the process tends to form precipitates and inclusions due to the excess tellurium in the melt. Telluride inclusions can be tens of microns in size and this may be significant for detector applications. Further, there will be a dislocation cloud associated with each inclusion which will affect the performance of detectors formed from the crystal.

In European Patent No EP-B-1019568 a method of forming crystals using a physical vapour phase technique is disclosed. This process is known as Multi-Tube Physical Vapour Phase Transport (MTPVT). According to this method, a sink or seed crystal of the material to be grown is provided. Vapour phase material is provided to the sink or seed crystal, causing nucleation and subsequent deposition of the material to grow the crystal onto the sink or seed crystal. The sink or seed crystal should be similar in material and structure to the crystal material to be grown, for example being only a doped or minor variation of the crystal composition. In particular, EP-B-1019568 discloses a method in which the sink or seed crystal is provided in a sink zone which is connected to a source zone via a passage able to transport vapour from the source zone to the sink zone. The temperature in the source and sink zones are controllable independently, the zones being thermally isolated.

Whilst the Multi-Tube Physical Vapour Phase Transport process disclosed in EP-B-1019568 is able to consistently produce crystals of a more uniform and higher quality, a problem remains that the size of crystals that can be grown is limited as the crystal cannot be any larger than the seed crystal on which it is grown.

Due to the limited size of crystals formed by the prior art methods, it has been known to produce detectors of large size by tiling together smaller crystals in an array. In this case, it is necessary to use computer software to compensate for the joints between the separate pieces of material.

It is also known to provide large substrates formed from materials such as silicon or gallium arsenide and to deposit a thin film of single crystal cadmium telluride or cadmium zinc telluride. The thin films can be deposited using thin film growth techniques such as molecular beam epitaxy, chemical vapour deposition, sputtering, metallo organic chemical vapour deposition (MOCVD), metal organic vapour phase epitaxy (MOVPE) and liquid phase epitaxy (LPE). These methods enable a single crystal thin film layer to be grown at rates of between 0.1 and 10 microns per hour, and therefore the thickness of the layer is very limited. Typically, the maximum thickness of such thin films is 1 to 10 microns. Although a thin film can be formed on a substrate to give a large area semiconductor crystal, such a film is not suitable for use as a detector for x-rays and gamma-rays. When detecting x-rays and gamma-rays, it is necessary to provide a sufficient thickness of material to stop the high energy photons. In order to capture 90% of the incident radiation at a photon energy of 100 keV[8], it is necessary for a CdTe layer to have a thickness of about 11 mm. Using typical methods for growing thin films, this would take around 10,000 hours. Therefore, suitable crystals cannot be grown using thin film deposition methods.

Whilst it is known that screen printing techniques can be used to deposit a thick layer of material on a substrate, these layers are not single crystal layers, and therefore are unsuitable for detection of x-rays and gamma rays.

International Patent Application No WO 2002/44443 discloses a method and apparatus for the production of Group III metal nitride materials, for example gallium nitride. According to the disclosure in this document, a base substrate is provided in a sputter deposition chamber together with a group III metal target. A highly energetic plasma-enhanced environment is generated in the chamber to sputter the target and produce a Group III metal source vapour. A nitrogen containing gas is also provided in the chamber. A reactant vapour species containing components of the group III metal and the nitrogen will be produced in the chamber, and will be deposited onto the substrate. In one embodiment, a buffer layer of group III metal nitride material is formed on the substrate, and the bulk group III metal nitride material is deposited onto the buffer layer by the reactive sputtering method. Such a method is unsuitable for the deposition of group II-VI materials as these cannot be physically sputtered or provided as a reactive gas.

EP-A-01691422 discloses the use of a metal organic vapour phase epitaxy method for the formation of a cadmium telluride or cadmium zinc telluride layer on a silicon or gallium arsenide substrate. This method is a chemical vapour deposition technique. According to one embodiment disclosed, a thin layer of cadmium telluride or cadmium zinc telluride, which may be doped with arsenic, is provided between the substrate and the cadmium telluride or cadmium zinc telluride growth layer. There are disadvantages of metal organic vapour phase epitaxy deposition techniques, for example the high cost of source materials, and the problems associated with the deposition of carbon from the metal organic precursors which are used. Such carbon must be periodically removed to minimise the risk of the deposits being shedded onto the growing crystal. This reduces the thickness that may be deposited in a single run.

SUMMARY OF THE INVENTION

According to one aspect of the present invention, there is provided a structure including a substrate, an intermediate layer provided and formed directly onto the substrate, a transition region and a bulk crystal of group II-VI material provided and formed as an extension of the transition region, the transition region provided a transition between the material of the intermediate layer and the bulk crystal material.

It has previously been considered that crystal mismatches between a substrate and bulk crystal material having different lattice structures prevent the formation of the bulk crystal material on such substrates, or would result in unacceptable stresses between the materials affecting the device unacceptably. For example, it is not generally considered possible to provide a cadmium telluride crystal material, which will have a lattice parameter a=6.481 Å directly onto a silicon substrate which will have a lattice parameter a=5.4309 Å due to the lattice mismatch. Accordingly, this limits the bulk crystal material that can be grown on any given substrate. However, the inventors have found that the inclusion of an intermediate layer and transition region between the substrate and the bulk crystal material according to the present invention enables a gradual change in the crystal structure between the substrate and bulk crystal that can compensate for any mismatch in the lattice structure of the substrate and deposited crystal material.

With the structure of the present invention, it is possible to form bulk crystal materials which differ from the substrate on which they are formed, and in particular which have a different lattice structure from the underlying substrate. These composite layered materials may have better physical or structural properties than conventionally known materials, and therefore may have different applications.

It is preferred that the intermediate layer should have a lattice structure compatible with the substrate.

In accordance with the present invention, preferred examples of substrates include silicon, gallium arsenide, and silicon carbide substrates. The group II-VI bulk crystal materials formed may include semiconductors such as cadmium telluride, cadmium manganese telluride and cadmium zinc telluride.

The intermediate layer may be of the same material or a different material from the bulk crystal material.

The transition region in which there is a transition from the material of the intermediate layer to the bulk crystal material may include a region of gradual change from the composition of the intermediate layer to that of the bulk crystal material.

In a preferred example, the transition region and bulk crystal can be deposited using the same growth technique, but with an initial variation in the growth parameters during the growth cycle to gradually change the composition and growth rate of the material deposited on the substrate. During the initial transition, the transition region is formed. After completing the change to the material of the bulk crystal to be deposited, the growth rate can be accelerated to rapidly deposit the bulk crystal material. In this case, it is preferred that the apparatus includes a means for introducing different source materials to be deposited onto the substrate.

The intermediate layer can also be formed using the same technique as the transition region and the bulk crystal layer.

In addition to the substrate, intermediate layer, transition region and the bulk crystal material, additional layers may be deposited. For example, a metal layer such as a layer of indium, platinum, gold or aluminium may be formed for electrical contact. Alternatively or additionally a dielectric layer may be provided. This is especially useful where the structure is to be used as a radiation detector as the dielectric layer may act as a filter to block visible and near infra red light.

According to a second aspect of the present invention, there is provided a method of growing a bulk single crystal material, in particular a group II-VI material, using a physical vapour phase deposition method. The method provides that the crystal material is formed on a seed substrate of a material different from the crystal material to be formed. To enable the crystal material to be formed on the foreign substrate, an intermediate layer of a single crystal material is first formed on the substrate, a transition region is formed on the intermediate layer and the bulk single crystal material is grown on the transition region by an appropriate vapour phase deposition method. The intermediate layer is generally a thin film layer.

The method of the present invention allows high quality bulk crystal material to be formed quickly using physical vapour phase deposition methods, enabling the required thickness of material to be formed in an acceptable time. Due to the use of a foreign seed, it is possible to produce crystal material having a larger size than has conventionally been possible by physical vapour phase deposition methods as larger foreign seed substrates are often available than seeds of the required crystal material. Therefore, the present invention provides the advantages associated with physical vapour phase deposition methods in terms of the speed of formation and quality of the crystal material, whilst allowing larger area crystals to be formed than is conventionally the case.

Although one advantage of the present invention is the ability to produce large size crystal materials for use in large detectors or the like, it is possible to divide the substrate and crystal material grown on the substrate into smaller pieces. By producing a single, large piece of crystal and then dividing this up into smaller pieces, it is considered possible to produce the required crystal material more quickly and with greater consistency than would be the case if the smaller pieces required were formed individually.

In one embodiment, the intermediate layer can be formed using standard thin film deposition techniques. These include molecular beam epitaxy, chemical vapour deposition, sputtering, metallo organic chemical vapour deposition (MOCVD), metal organic vapour phase epitaxy and liquid phase epitaxy. Whilst all of these methods are relatively slow, since the intermediate layer is very thin, the growth rate of the layer is not of significant importance in the overall manufacturing process. In an alternative embodiment, physical vapour phase deposition techniques are used to grow the thin film intermediate layer on the substrate. When vapour phase deposition techniques are used for of growth of crystal materials, typically at a growth rate of between 100 and 500 microns/hour, it is necessary for the growth to provide an underlying layer of the same material as that to be deposited. However, when the conditions are adjusted to grow a thin film at a growth rate of between 1 and 10 microns/hour, the thin film can be grown on a foreign seed.

The transition region and bulk crystal can be deposited using the same growth technique, but with a variation in the growth parameters during the growth cycle to gradually accelerate the rate of growth. In particular, when the material is initially deposited on the substrate, the growth rate will be slow, enabling the materials to be properly nucleated and formed. After depositing this initial material, the growth parameters can be changed to increase the rate of formation of the crystal material. Where the same technique is used to form the intermediate layer, there will be an initial region where the deposition changes from the slow, thin film type, deposition to the faster, bulk crystal, deposition. This change may be a gradual change, or may be an abrupt change.

The parameters that should be changed may include at least one of the source temperature ($T_{source}$) and the substrate temperature ($T_{sub}$). A variation in the source and/or substrate temperature will result in a change of the temperature differential ($\Delta T$). Typically, the minimum source temperature will be around 450° C. to ensure the sublimation of the material. At temperatures lower than 450° C., no substantial sublimation will occur. The minimum substrate temperature is around 200° C. By increasing the temperature differential, for example by increasing the source temperature, the overall growth rate may be increased. It will be appreciated that the growth and sublimation temperatures are dependent on the material being deposited. For example, the growth temperature for mercury iodide is around 100 to 150° C. and the sublimation temperature is around 200 to 300° C.

It is preferred that the transition region and/or bulk crystal material is grown using a multi-tube physical vapour phase transport method, such as that disclosed in EP-B-1019568.

The seed substrate can be formed from various materials. However, preferred materials for these substrates are silicon and gallium arsenide. An advantage of forming crystals on a silicon and gallium arsenide substrate is that these substrates have good mechanical strength and commercially available at an acceptable price. This both helps ensure that the crystal material is consistently formed on the substrate, which may be more difficult with a less robust substrate, and also helps maintain the integrity of the formed material in subsequent processing, use and transportation.

The substrate may be of any size required, depending upon the required size of the crystal material. However, it is preferred that the substrate has a diameter greater than 25 mm, preferably greater than 50 mm, and most preferably at least 150 mm. The substrate can be as large as is available at the time.

The bulk crystal materials formed may include cadmium telluride and cadmium zinc telluride (CZT), cadmium manganese telluride, and silicon carbide (SiC). Where the material is cadmium zinc telluride, this will have the composition $Cd_{1-x}Zn_xTe$.

BRIEF DESCRIPTION OF THE DRAWINGS

The present invention will now be described by way of example with reference to the accompanying drawings, in which.

DETAILED DESCRIPTION OF A PREFERRED EXAMPLE

Figure 1:
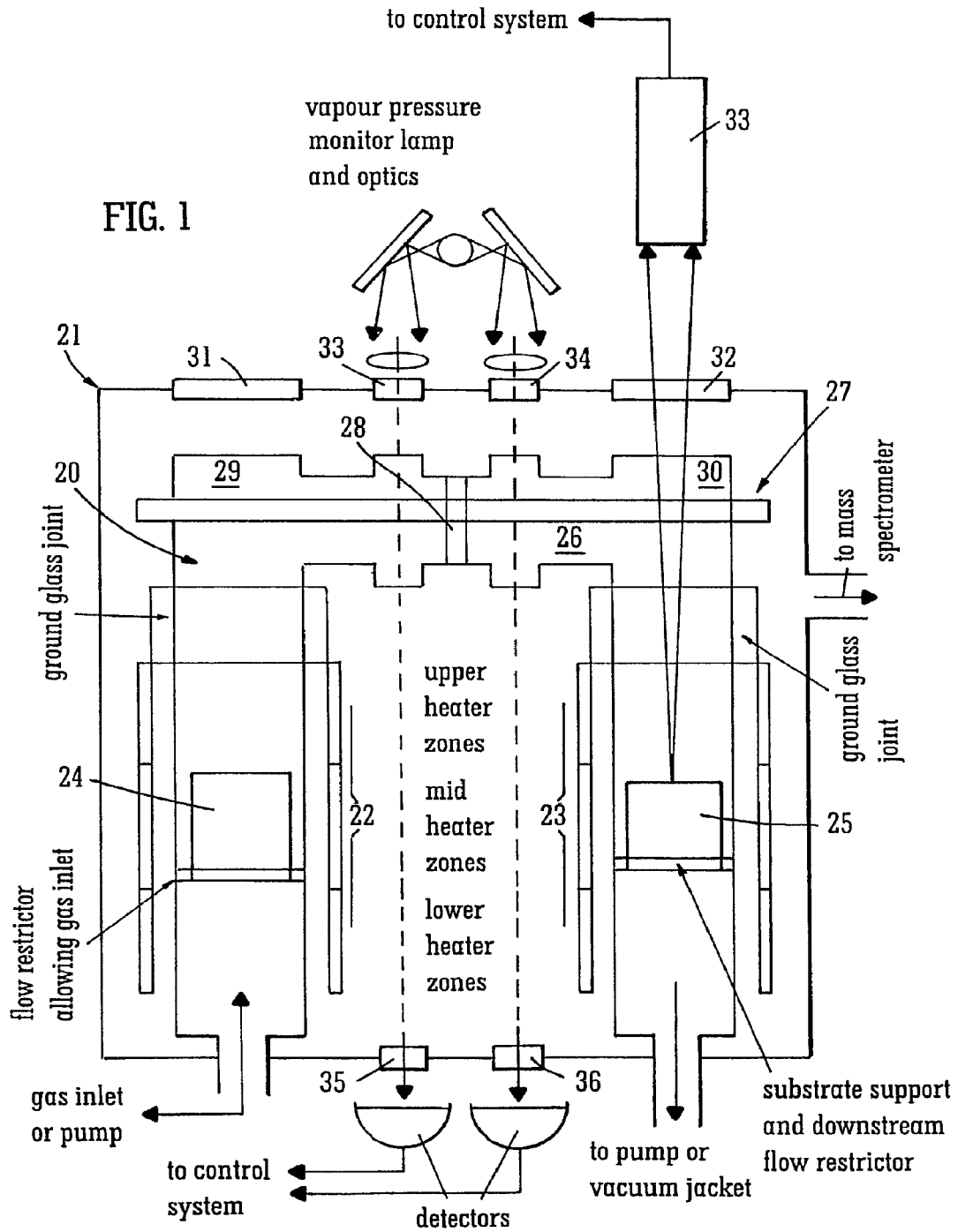
FIG. 1 shows a suitable multi-tube physical vapour phase transport device for growing structures according to the present invention; and, FIG. 2 shows a cross section of a material structure according to the present invention.

A preferred apparatus for the formation of a structure according to the present invention is shown in FIG. 1. The apparatus is suitable for forming bulk single crystal materials. Generally bulk crystal materials will have a thickness of at least 500 microns.

The apparatus comprises an evacuated U-tube in the form of a quartz envelope 20 encased in a vacuum jacket 21. Two separate three zone vertical tubular furnaces are provided 22, 23 for the source 24 and the sink zone 25 respectively. The source and sink zones are connected by an optically heated horizontal crossmember 27 forming a passage 26. A flow restrictor 28 is provided in the passage 26. The passage comprises two separate points of deviation—in each case at an angle of 90°—providing respective junctions between diverging passages for in-situ monitoring and vapour transport from the source to the sink zone. Windows allowing optical access to source and sink respectively are provided. The temperature of the surface of growing crystal in the sink zone can be monitored by a pyrometer or other optical diagnostic apparatus 33 located external to the vacuum jacket and in optical communication with the surface of the growing crystal. The diagnostic apparatus is in communication with a suitable control system to vary the sink zone temperature. The apparatus also comprises means for in-situ monitoring of vapour pressure by access ports 33 to 36 in the region of the flow restrictor 28, through which vapour pressure monitoring lamps and optics may be directed from a position external to the vacuum jacket with detectors located as shown at a location 35, 36 diametrically opposed with respect to the passage for vapour transport 26. These are suitably linked to a control system providing for process control.

The source tube, growth tube and crossmember, in which transport takes place, are fabricated from quartz and the system is demountable with ground glass joints between the crossmember and the two vertical tubes allowing removal of grown crystals and replenishment of source material. Radiation shields (not shown for clarity) together with the vacuum jacket which surrounds the entire system provide thermal insulation. A flow restrictor such as a capillary or a sintered quartz disc is located in the centre of the crossmember. Growth takes place on a substrate located on a quartz block in the growth tube with the gap between this glass block and the quartz envelope forming the downstream flow restrictor. Provision is made for a gas inlet to the source tube and the growth tube may be pumped by a separate pumping system or by connection to the vacuum jacket via a cool dump tube.

A number of additional source tubes may be provided. In this case, the additional source tubes can include different materials for deposition, and will include separate heaters.

Figure 2:
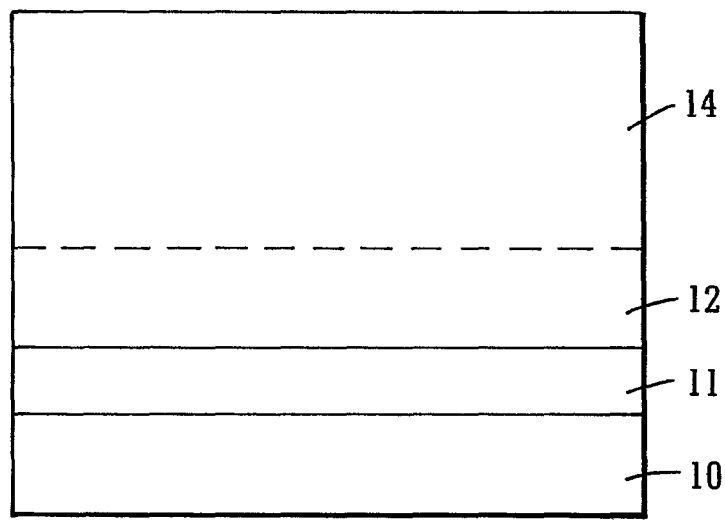

The structure of the device according to the present invention is shown in FIG. 2. As will be described in more detail below, the structure comprises a substrate 10, an intermediate layer 11, a transition region 12 and a bulk crystal material 14. In a preferred example, the overall structure can be defined by the formula a:b:$y_{1,2,3}$...:c where a is the substrate 10, b is the intermediate layer 11, c is the bulk crystal material 14 and $y_{1,2,3}$... is the interfacial or transition region 12.

The substrate 10 is provided in the apparatus as described with respect to FIG. 1. The substrate can be one of a number of different materials, including silicon, gallium arsenide, germanium, silicon carbide and sapphire.

The substrate 10 will typically have a thickness greater than 100 microns, preferably of at least 200 microns for mechanical stability and can have any available size. Silicon substrates with a diameter of up to 300 mm are currently available.

A source is provided to supply a material to be deposited onto the substrate 10.

There are a number of factors which determine whether a particular material can suitably be deposited on an existing layer, or whether problems will arise from the mismatch between the adjacent layers. A mismatch may occur where there is a mismatch between parameters such as the lattice parameters, the thermal expansion coefficient and/or the coefficients of elasticity. Ideally, the parameters for the material of adjacent layers should be as close as possible to minimise mismatches. Where there is a large difference in the lattice parameters for adjacent layers, for example where the difference between lattice parameters is greater than 3%, misfit dislocations will occur as the subsequent layer is deposited. However, these misfit dislocations will in most cases grow out over the first few atomic layers—typically within 10 microns—so that the remainder of the material will be fully relaxed. However, this relaxation occurs only at the temperature of growth. Where there is a difference between the thermal expansion coefficients of the adjacent layers, at temperatures other than the temperature of growth, there will be thermal strain. Such strain can be transmitted to other layers in the structure, for example to the substrate or crystal material. Where the crystal material is sufficiently thick, the strain will generally be located in the substrate. For example, it has been found that when a CdTe layer, with a thickness of about 250 microns, is formed on a 350 micron gallium arsenide substrate at 500° C., there will be substantially no strain in the CdTe layer when the device is held at a temperature of around 700° C. during subsequent crystal formation.

According to one example of the present invention, the source is selected so as to initially deposit the intermediate layer 11. The intermediate layer will have a thickness of between about 10 and 1000 microns, preferably in the region of 100 to 700 microns. An intermediate layer of this thickness will withstand any initial sublimation of the layer during the initial stages of bulk crystal growth. As discussed above, a thickness of 10 microns will be sufficient for misfit dislocations to grow out, and a thicker layer will help ensure that any strain will be primarily located in the substrate. Where the substrate is a silicon substrate, this will have a lattice parameter a=5.4309 Å. In this case, and the intermediate layer may comprise an initial layer of GaP deposited on the substrate. GaP has a lattice parameter a=5.4506 Å. This lattice parameter is sufficiently close to that of the underlying silicon substrate 10 that any lattice mismatch is minimised.

The source material supplied to the growth chamber may be altered so as to deposit a transition region on the GaP layer. The transition region y will have a thickness of between about 10 and 200 microns, preferably up to about 500, to achieve lattice and thermal matching. The region may be considered a number of layers $y_1$, $y_2$, $y_3$ etc of different materials or properties to complete the transition from the intermediate layer 11 to the bulk crystal material 14 or may be considered a gradual transition. In one particular example, the transition layer may comprise a single layer of CdSe having a lattice parameter a=6.05 Å.

After forming the transition layer y, the bulk crystal material 14 can be deposited by changing the source material. A preferred bulk crystal material is cadmium telluride which has a lattice parameter a=6.481 Å. The bulk crystal material may be deposited to a thickness of about 700 microns or more. This is important where the material is required to ensure effective absorption of high energy radiation. It has been found that to absorb 90% of x-rays at 100 KeV, a thickness of 11 mm is required.

During the formation of the transition region, the growth parameters are controlled such that the transitional region has a desired thickness. Once the transition has been made to the bulk crystal material to be deposited, the growth parameters can be adjusted so that the bulk crystal material can be deposited at a higher rate.

Various possible material structures can be achieved in accordance with the present invention. The transitional region will typically be very small compared to the substrate and bulk crystal material, and therefore the effects are considered negligible in the overall device.

The selection of the substrate will generally be determined by the availability of substrates of a required size, but other factors include the mechanical strength, thermal expansion and elasticity coefficients required for a desired application. Differences in the lattice parameters and elasticity and thermal expansion coefficients between the bulk crystal material and substrate can be compensated for in accordance with the present invention, although it will be appreciated that if the substrate can be chosen to minimise these differences, the overall structure may be improved.

Examples of possible structures, giving the substrate, intermediate layer and bulk crystal material are set out below.

| Example | Substrate | Intermediate Layer + trace elements | Bulk Crystal | Overall Structure |
| --- | --- | --- | --- | --- |
| 1 | Si | CdTe | CdTe | Si: CdTe: CdTe |
| 2 | Si | CZT | CZT | Si: CZT: CZT |
| 3 | Si | CZT | CdTe | Si: CZT: CdTe |
| 4 | Si | CdTe | CZT | Si: CdTe: CZT |
| 5 | GaAs | CdTe | CdTe | GaAs: CdTe: CdTe |
| 6 | GaAs | CZT | CZT | GaAs: CZT: CZT |
| 7 | GaAs | CZT | CdTe | GaAs: CZT: CdTe |
| 8 | GaAs | CdTe | CZT | GaAs: CdTe: CZT |
| 9 | Ge | CdTe | CdTe | Ge: CdTe: CdTe |
| 10 | Ge | CZT | CZT | Ge: CZT: CZT |
| 11 | Ge | CZT | CdTe | Ge: CZT: CdTe |
| 12 | Ge | CdTe | CZT | Ge: CdTe: CZT |
| 13 | Silicon Carbide | CdTe | CdTe | Silicon Carbide: CdTe: CdTe |
| 14 | Silicon Carbide | CZT | CZT | Silicon Carbide: CZT: CZT |
| 15 | Silicon Carbide | CZT | CdTe | Silicon Carbide: CZT: CdTe |
| 16 | Silicon Carbide | CdTe | CZT | Silicon Carbide: CdTe: CZT |
| 17 | SiC | CdS | CdTe | SiC: CdS: CdTe |
| 18 | SiC | CdS | CZT | SiC: CdS: CZT |

One particular advantage of devices made in accordance with the present invention is that the different materials used to form the substrate, intermediate layer and bulk crystal material may provide different functions in the final apparatus. For example, in the example of a silicon substrate, cadmium telluride bulk crystal material, the cadmium telluride material may be used to detect high-energy photons, whilst the silicon substrate may be able to detect lower energy photons.

Where the material is to be used for detection of radiation, the required thickness of the material will be dependent upon the energy to be absorbed. For cadmium telluride, cadmium zinc telluride and cadmium manganese telluride, the thickness of material required for absorption of radiation of various energies is as set out below:

| Photon Energy | Thickness required for 50% absorption |
| --- | --- |
| 30 keV | 0.007 cm |
| 100 keV | 0.07 cm |
| 200 keV | 0.35 cm |
| 500 keV | 1.2 cm |
| 750 keV | 1.7 cm |
| 1-10 MeV | 2.3-3.5 cm |

In one embodiment of the present invention, a bulk cadmium zinc telluride layer is formed on a silicon substrate. In this case, the silicon substrate is first treated to remove any oxides. This treatment may include chemical etching or heating the substrate to a high temperature in an ultra high vacuum. The silicon substrate is provided in the growth chamber, with separate sources of zinc telluride and cadmium telluride.

The preferred temperature for the growth of the crystal material is around 700° C., and accordingly the temperature of the silicon substrate is increased to this temperature. The temperature of the zinc telluride and cadmium telluride sources is then increased at a rate of about 2° C. per minute until the temperature of these reaches the same temperature as that of the substrate. Thereafter, the temperature of the cadmium telluride source is maintained at this level, whilst the temperature of the zinc telluride source is increased at the same rate to a temperature of around 870° C. When the zinc telluride source reaches a temperature of around 870° C., the temperatures of the substrate and source materials are maintained for around 5 hours. This causes the growth of an intermediate layer of zinc telluride to a thickness of around 50 microns on the substrate. Thereafter, the temperature of the substrate is maintained at around 700° C. and the temperature of the zinc telluride source is maintained at around 870° C. whilst the temperature of the cadmium telluride source is increased to the same temperature as the zinc telluride source material at a rate of around 2° C. per minute. As the cadmium telluride material is heated, the material layer grown on the substrate will gradually change composition from the zinc telluride material of the intermediate layer to a cadmium zinc telluride material with about 4% zinc. The resulting transition region will have a thickness of around 100 microns. The transition region could be reduced in thickness by increasing the rate of temperature increase of the cadmium telluride source, or could be made thicker by decreasing the rate of temperature increase. Thereafter, bulk crystal cadmium zinc telluride material will be deposited whilst the temperatures of the source materials are held at a higher temperature than the substrate. The precise composition of the deposited bulk crystal material can be controlled by varying the relative temperature of the two source materials.

In an alternative example, the intermediate layer is deposited on the upper surface of the seed plate by a conventional thin film deposition method. Suitable methods include molecular beam epitaxy, chemical vapour deposition, sputtering, metallo organic chemical vapour deposition (MOCVD), metal organic vapour phase epitaxy and liquid phase epitaxy methods. The thin film layer of the required crystal material is deposited or grown on the substrate at a typical rate of between 0.1 and 10 micron per hour, although could be greater. However, only a very thin layer is required to be formed on the upper surface of the substrate, typically having a thickness of between about 1 and 10 microns, although could be greater. The film thickness should be at least 1 micron to ensure that the layer is fully relaxed. The maximum thickness of the layer is preferably 10 microns so that the layer can be formed within an acceptable time.

After forming the thin film on the upper surface of the substrate, the substrate is removed from the growth chamber, and is treated, for example being cleaned and polished. The substrate is then provided for the growth of the transition region and the bulk crystal material using a physical vapour phase method.

The invention claimed is:

1. A structure including a substrate, an intermediate layer provided and formed directly onto the substrate, a transition region, and a group II-VI bulk crystal material provided and formed as an extension of the transition region, wherein the substrate comprises a substrate of silicon, gallium arsenide, germanium, or silicon carbide, the substrate has a thickness of at least 100 microns, the bulk crystal material has a thickness of at least 700 microns, the intermediate layer has a thickness of between 25 and 1000 microns, and the transition region between the intermediate layer to the material of the bulk crystal has a thickness of between 10 and 500 microns.

2. A structure according to claim 1, in which the substrate has a thickness of at least 200 microns.

3. A structure according to claim 1, in which the substrate has a diameter greater than 25 mm.

4. A structure according to claim 1, in which the bulk crystal material comprises cadmium telluride, cadmium zinc telluride, or cadmium manganese telluride.

5. A structure according to claim 1, in which the intermediate layer comprises a group II-VI material.

6. A structure according to claim 5, in which the group II-VI material in the intermediate layer is CdTe, CZT, or CdS.

* * * * *